United States Patent
Ramos et al.

(10) Patent No.: US 10,134,594 B2
(45) Date of Patent: Nov. 20, 2018

(54) METHOD FOR MANUFACTURING AN ELECTRICAL CONTACT ON A STRUCTURE

(71) Applicant: COMMISSARIAT A L'ENERGIE ATOMIQUE ET AUX ENERGIES ALTERNATIVES, Paris (FR)

(72) Inventors: Raphael Ramos, Grenoble (FR); Jean Dijon, Champagnier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/619,931

(22) Filed: Jun. 12, 2017

(65) Prior Publication Data
US 2017/0358451 A1 Dec. 14, 2017

(30) Foreign Application Priority Data
Jun. 13, 2016 (FR) ...................................... 16 55432

(51) Int. Cl.
*H01L 21/265* (2006.01)
*H01L 21/02* (2006.01)

(52) U.S. Cl.
CPC .... *H01L 21/265* (2013.01); *H01J 2893/0022* (2013.01); *H01L 21/02527* (2013.01);
(Continued)

(58) Field of Classification Search
CPC ............. H01L 21/265; H01L 21/02527; H01L 21/02606; H01L 21/02603;
(Continued)

(56) References Cited

U.S. PATENT DOCUMENTS

| 8,604,459 B1 | 12/2013 | Ward et al. |
| 2010/0006823 A1* | 1/2010 | Anderson ........... H01L 29/1606 257/24 |

(Continued)

FOREIGN PATENT DOCUMENTS

| CN | 103943512 A | 7/2014 |
| EP | 0 067 090 B1 | 2/1985 |

OTHER PUBLICATIONS

U.S. Appl. No. 14/371,300, filed Jul. 9, 2014, 2014/0369005 A1, Jerome Gavillet et al.

(Continued)

*Primary Examiner* — Thanh T Nguyen
(74) *Attorney, Agent, or Firm* — Oblon, McClelland, Maier & Neustadt, L.L.P.

(57) ABSTRACT

The invention relates to a method for manufacture of an electrical contact on a structure (10) made of an anisotropic material NA which exhibits an anisotropic electrical conductivity, where the structure (10) exhibits an axial electrical conductivity along a first axis XX' of the structure (10) and an orthogonal conductivity along a direction YY' orthogonal to the first axis XX' of the structure (10), where the orthogonal conductivity is less than the axial conductivity, where the method comprises:
  a step for the formation of a conductive electrode (20), with an initial thickness Ei, comprising a species M, on a first surface (30) of the structure (10), where the first surface (30) is orthogonal to the orthogonal direction YY';
  the method being characterized in that the step for the formation of the conductive electrode (20) is followed by a step for implantation of species X through the conductive electrode (20), into the structure (10).

16 Claims, 3 Drawing Sheets

Figure 1:
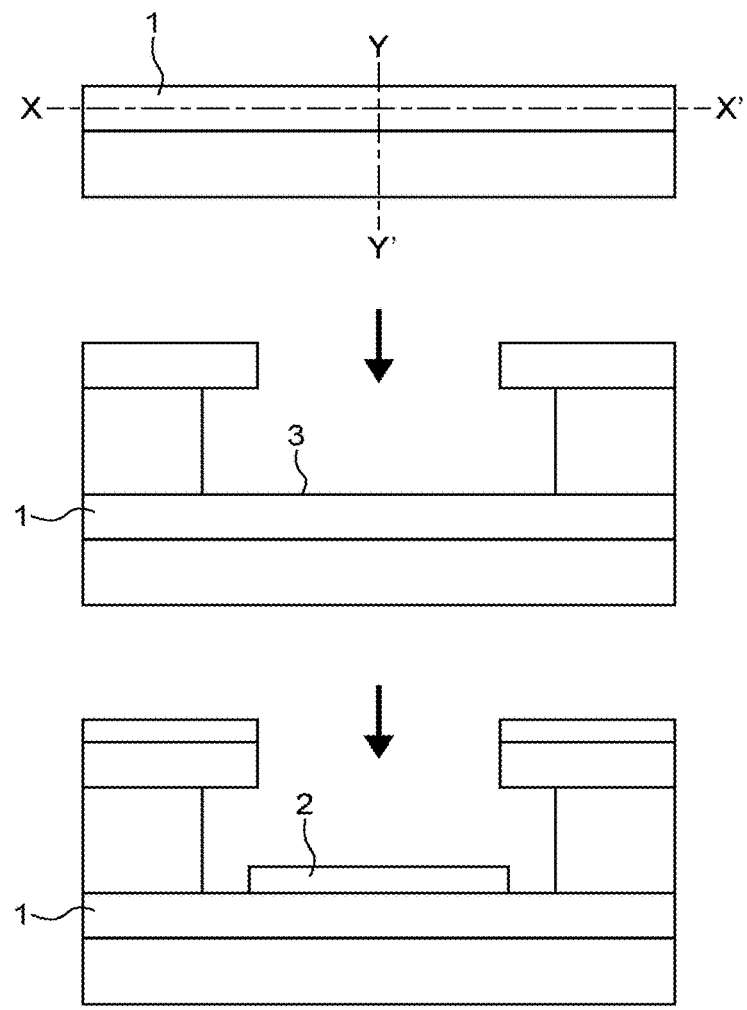

(52) U.S. Cl.
CPC .. *H01L 21/02568* (2013.01); *H01L 21/02601* (2013.01); *H01L 21/02603* (2013.01); *H01L 21/02606* (2013.01)

(58) Field of Classification Search
CPC ......... H01L 21/02601; H01L 21/02568; H01L 51/002; H01L 51/0048; H01J 2893/0022
See application file for complete search history.

(56) References Cited

U.S. PATENT DOCUMENTS

| | | | |
|---|---|---|---|
| 2013/0059134 A1 | 3/2013 | Chai et al. | |
| 2014/0001440 A1* | 1/2014 | Bojarczuk | H01L 29/517 257/27 |
| 2015/0214496 A1* | 7/2015 | Du | H01L 51/0558 257/29 |
| 2015/0243826 A1* | 8/2015 | An | H01L 31/028 250/200 |
| 2016/0380218 A1* | 12/2016 | Afzali-Ardakani | H01L 51/0516 438/157 |

OTHER PUBLICATIONS

U.S. Appl. No. 15/119,615, filed Aug. 17, 2016, 2017/0062870 A1, Sebastien Liatard et al.

French Preliminary Search Report dated Mar. 14, 2017 in French Application 16 55432 filed Jun. 13, 2016 (with English Translation of Categories of Cited Documents).

Adrien Allain et al., "Electrical contacts to two-dimensional semiconductors," Nature Materials, vol. 14, Dec. 2015, pp. 11.

U. Bangert et al., "Doping of few-layered graphene and carbon nanotubes using ion implantation," Physical Review B 81, 245423, 2010, pp. 11.

U. Bangert et al., "Ion Implantation of Graphene-Toward IC Compatible Technologies," Nano Letters, 2013, pp. 6.

Debdeep Jena et al., "2D crystal semiconductors: Intimate contacts," Nature Materials, vol. 13,Dec. 2014, pp. 3.

Jiahao Kang et al., "High-performance MoS2 transistors with low-resistance molybdenum contacts", Applied Physics Letters 104, 2014, pp. 6.

Joshua T. Smith et al., "Reducing Contact Resistance in Graphene Devices through Contact Area Patterning," ACS Nano, vol. 7, No. 4, 2013, pp. 7.

Wei Sun Leong et al., "Low-Contact-Resistance Graphene Devices with Nickel-Etched Graphene Contacts", ACS Nano, vol. 8, No. 1, 2014, Pagers 8.

Joshua A. Robinson et al., "Contacting graphene", Applied Physics Letters 98, 2011, pp. 4.

R.S. Nelson, "The Theory of Recoil Implantation", Radiation effects, vol. 2, 1969, pp. 4.

G. Dearnaley , "Bombardment-Diffused Coatings and Ion Beam Mixing," Radiation effects, vol. 63, 1982, pp. 13.

R. Angelucci et al. "Boron ion implantation through Mo and Mo silicide layers for shallow junction formation," Journal of Applied Physics 69, 1991, pp. 7.

Nguyen Van Hieu, "Formation of source and drain of a-Si:H TFT by ion implantation through metal technique," ScienceDirect, Physica B 392, 2007, pp. 5.

* cited by examiner

METHOD FOR MANUFACTURING AN ELECTRICAL CONTACT ON A STRUCTURE

TECHNICAL FIELD

The invention relates to a method for manufacturing an electrical contact on a structure. More specifically the invention relates to a method for making an electrical contact on a structure made of a material which exhibits anisotropic electrical conductivity.

STATE OF THE PRIOR ART

Structures made of materials which exhibit anisotropic electrical properties such as carbon nanotubes are very promising for applications in the fields of microelectronics, spintronics, opto-electronics, sensors or transparent electrical conductors.

Connecting these structures to the outside world using electrodes can present certain difficulties, however. Indeed, even though the creation of electrodes which exhibit a low contact resistivity on materials such as silicon is well understood by those skilled in the art, the opposite is not true when the structure is made of an anisotropic material and exhibits anisotropy in terms of electrical conductivity (hereafter referred to as "anisotropic material").

In effect, FIG. 1 shows a method of manufacture, known in the state of the art, of an electrode 2 on a structure 1 made of an anisotropic material NA which exhibits anisotropic electrical conductivity. The electrode 2 may be, for example, a metallic electrode. The structure 1 exhibits an axial electrical conductivity $\sigma_{//}$ along a first axis XX' of the structure 1, and at least one orthogonal electrical conductivity $\sigma_\perp$ along at least one direction YY' orthogonal to the first axis XX' of the structure 1. The at least one electrical conductivities $\sigma_\perp$ is/are less than the axial electrical conductivity $\sigma_{//}$. The method comprises a step for the formation of an electrode 2 with an initial thickness $E_i$, comprising, for example, a species M, on a first surface 3 of the structure 1, where the first surface 3 is orthogonal to the at least one directions YY'.

According to this method known in the state of the art, the structure 1 extends along the first axis XX'.

The orthogonal electrical conductivity $\sigma_\perp$ along the direction YY' orthogonal to the first surface 3 is generally very low. Moreover, the first surface 3 is generally chemically inert along the direction YY' orthogonal to said surfaces. In other words, the first surface 3 does not form chemical bonds along the direction perpendicular to said first surface 3. Thus once an electrode 2 is formed on the first surface 3, a high-energy barrier (tunnel barrier) to the passage of an electrical current between electrode 2 and the first surface 3 may be observed. This high-energy barrier is expressed as a high contact resistance between electrode 2 and the first surface 3.

Figure 2:
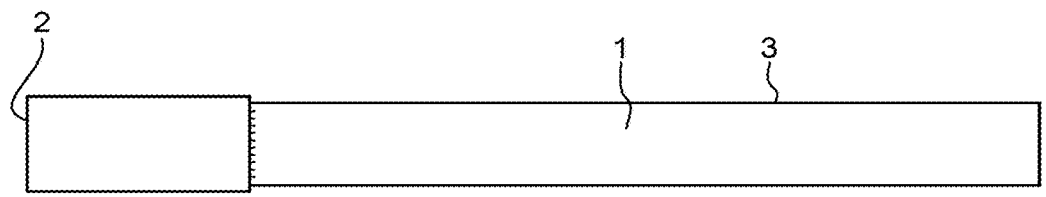

To this end, the anisotropic material NA may comprise graphene, a carbon nanotube or a bundle of carbon nanotubes. The first surface 3 therefore comprises atoms of carbon arranged in a chemically inert crystallographic hexagonal mesh. In order to overcome this problem it has been proposed that the electrode 2 be made along a plane or surface that is perpendicular to the first axis XX' of the structure 1. To this end, those skilled in the art may consult document [1] cited at the end of the patent application. FIG. 2 illustrates one such example. The terminology used for this is "Edge Contact". True edge contact is, however, difficult to implement. Consequently top contacts are by far the most widely used, on the one hand since they are technically simpler to make than an edge contact, and on the other hand since it is very difficult to make a true edge contact.

Thus in order to improve the performance of metallic top contacts, the introduction of an interface material between the anisotropic material and the electrode has been proposed. For example, in the case of an anisotropic material NA made of graphene, the interface material is advantageously graphite [2] whist molybdenum [3, 4] constitutes an interface of choice when the anisotropic material is $MoS_2$.

This approach, then, requires that an appropriate choice of the interface material be made depending on the nature of the electrode 2 and on the anisotropic material NA under consideration, in order to achieve the desired performance. Therefore an interface material may not be available or may require operating conditions which are incompatible with the nature of the structure 1 (for example the material may require high temperatures for its formation).

Alternatively, in the case of graphene it has been proposed to confer an "edge contact" character upon a top contact.

The alternative methods comprise, prior to the formation of the metallic contact, the formation of holes in the graphene beneath the contact.

To this end those skilled in the art can refer to documents [5], [6] and [7] cited at the end of the patent application.

In document [5], cavities are formed on the first surface 3 such that the electrode 2 "penetrates" into the volume of the structure 1. The formation of cavities however requires the use of a photo-lithographic step which because of its resolution does not allow electrodes of small size, for example of less than 50 nm, to be formed.

Furthermore, this technique cannot easily be implemented on a structure 1 made of carbon nanotubes.

The approach proposed in the document [6] also uses a method for forming cavities from the first surface 3 by means of an etching method with nickel nanoparticles. This method however cannot be performed on transition dichalcogenide molecules (for example $MoS_2$).

Finally the approach proposed in document [7] implements a treatment of the first surface 3 by an oxygen plasma before the formation of the electrode. This method therefore only applies to carbon nanomaterials and may be difficult to implement in the case of two-dimensional compounds, for example.

One aim of the invention therefore is to propose a method for manufacturing an electrical top contact on a structure comprising an anisotropic material NA and which exhibits an interface resistivity, between the electrode and the structure, lower than that known in the state of the art.

Another aim of the invention is to propose a method of manufacture of an electrical contact which is compatible with the micro-fabrication techniques known to those skilled in the art.

Another aim of the invention is also to propose a method of manufacture of an electrical contact which may be implemented using nanotubes of carbon, graphene, transition metal dichalcogenides, bi-dimensional materials and Van de Waals heterostructures.

DESCRIPTION OF THE INVENTION

The aims of the invention are achieved, at least in part, by a method for manufacture of an electrical contact on a structure made of anisotropic material NA which exhibits an anisotropic electrical conductivity, where the structure exhibits an axial electrical conductivity $\sigma_{//}$ along a first axis XX' of the structure and at least one orthogonal electrical conductivity $\sigma_\perp$ along at least one direction YY' orthogonal to the first axis XX' of the structure, where the at least one electrical conductivities $\sigma_\perp$ are less than the axial electrical conductivity $\sigma_{//}$, where the method comprises:

- a step for the formation of an electrode with an initial thickness $E_i$ comprising at least one species M, on a first surface of the structure, where the first surface is orthogonal to the at least one directions YY';
- the electrode formation step is followed by a step of implantation of species X through the electrode, into the structure.

Thus the implantation step can be used to de-structure, at least in part, the volume of the implanted structure. The term 'de-structure' means breaking the chemical bonds and generating atomic disorder in the structure.

Unlike the known methods in the state of the art, the interface formed by the electrode and the structure according to the invention is diffuse (in other words it is not abrupt). This effect is particularly advantageous in the case of structures which exhibit a high degree of anisotropy of electrical conductivity and a high thickness value along a direction orthogonal to the first surface (the case of bundles of carbon nanotubes and of Van de Waals heterostructures). In effect, when the electrical contact is made according to the invention, a greater portion of the volume of the structure participates in electrical conductivity. In effect, according to the invention, a greater portion of the crystals are connected to the electrode. This effect means that a reduction in the size of the electrode relative that known in the state of the art can be envisaged (by reduction in the size of the electrode we also mean a reduction of the portion of the first surface area covered by the electrode).

Moreover the presence of the electrode during the implantation step protects the structure. In effect, by way of an example, the Applicant has observed that carbon nanotubes are destroyed, at least locally (at the implanted volume) if they are implanted before formation of the electrode.

Furthermore, the method according to the invention requires less severe cleaning conditions before formation of the electrode. In effect, the implantation step encourages closer contact between the electrode and the structure. This effect is particularly advantageous in the case of a structure made of carbon nanotubes or of graphene, in which contamination with carbon-containing products is very difficult to reduce. The method according to the invention is consequently less sensitive to contamination.

According to one embodiment, the step for implantation of species X is carried out solely through the electrode.

Thus a mask with an opening which corresponds to the electrode may be arranged on the structure during the step for implantation of the species X.

According to one embodiment, the species M is implanted by recoil into the structure during the step for implantation of the species X.

According to one embodiment, the species M is adapted to form chemical bonds with the anisotropic material NA.

The formation of the chemical bonds between the species M and the anisotropic material allows effective introduction of electrons into the structure, in the manner of edge contacts described earlier.

According to one embodiment, the species X are adapted to form chemical bonds with the anisotropic material NA.

According to one embodiment, the species X and the species M are of the same chemical nature, advantageously identical.

According to one embodiment, the implantation step is carried out using an implantation energy of the species X which confers upon the species X sufficient energy to pass through the structure, when it is without an electrode, in its entirety through the first surface and along a direction YY' orthogonal to said first surface.

According to one embodiment, the step for implantation of the species X is achieved in such a way that at the end of said step the electrode M exhibits a non-zero residual thickness which is less than the initial thickness $E_i$ and than the implantation depth Rp of the species X in the conductive electrode.

According to one embodiment, the step for implantation of species X is followed by a step comprising thickening of the electrode.

According to one embodiment, the anisotropic material NA comprises at least one of the materials chosen from amongst: an isolated carbon nanotube, a bundle of carbon nanotubes, graphene (single- or multi-layer, as well as its derivatives), transition metal dichalcogenide, semi-conductive two-dimensional materials, Van der Waals heterostructures.

According to one embodiment, the species M comprises at least one element chosen from amongst: Pd, Au, Ti, Ta, Cr, Al, Mo, Co, W, Ni, Pt, Zr, Nb, Ga, In, Bi.

According to one embodiment, the initial thickness $E_i$ is between 0.1 nm and 50 nm.

According to one embodiment, the implanted species X comprise at least one element chosen from amongst: Pd, Au, Ti, Ta, Cr, Al, Mo, Co, W, Ni, Pt, Zr, Nb, Ga, In, Bi, Ar, Kr, Xe, S, Se, Te.

According to one embodiment, the step for implantation of species X is carried out at an implantation energy of between 0.1 and 1000 keV.

According to one embodiment, the step for implantation of species X is carried out in accordance with a dose of species X of between $10^{10}$ and $10^{18}$ ions per $cm^2$.

According to one embodiment, the step for implantation of species X is followed by thermal annealing carried out at a temperature of between 300 and 500° C., in an inert or reducing atmosphere.

BRIEF DESCRIPTION OF THE ILLUSTRATIONS

Figure 3:
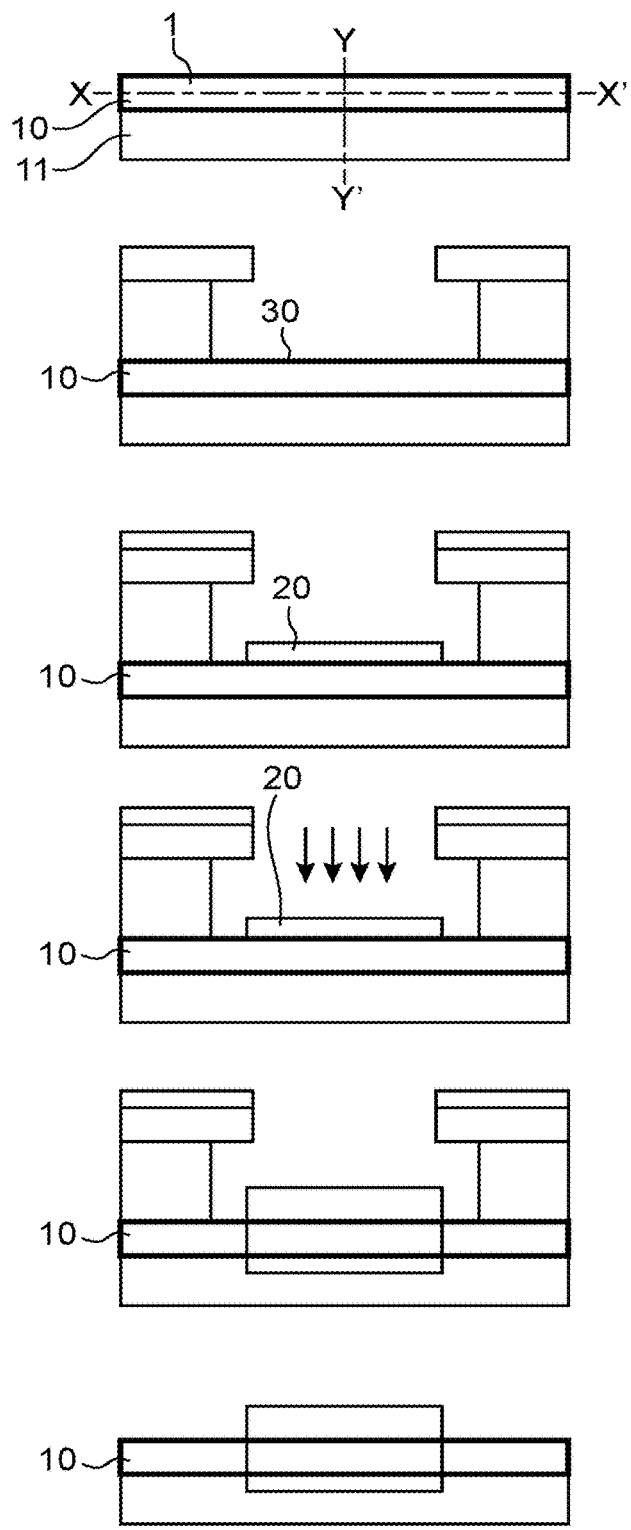
Figure 4:
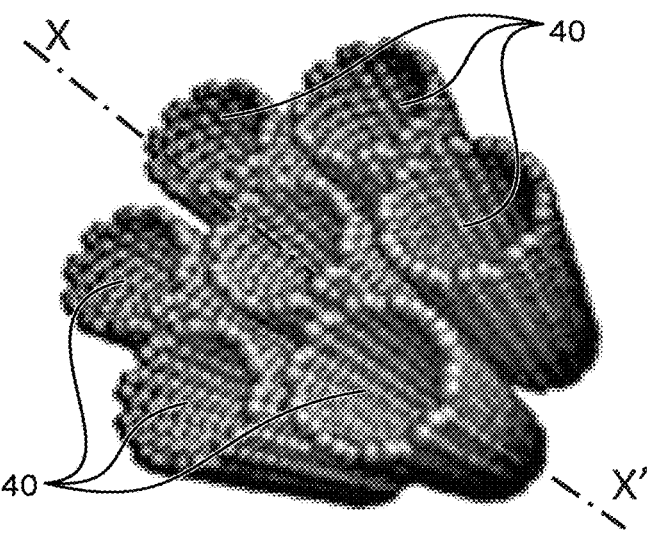
Figure 5:
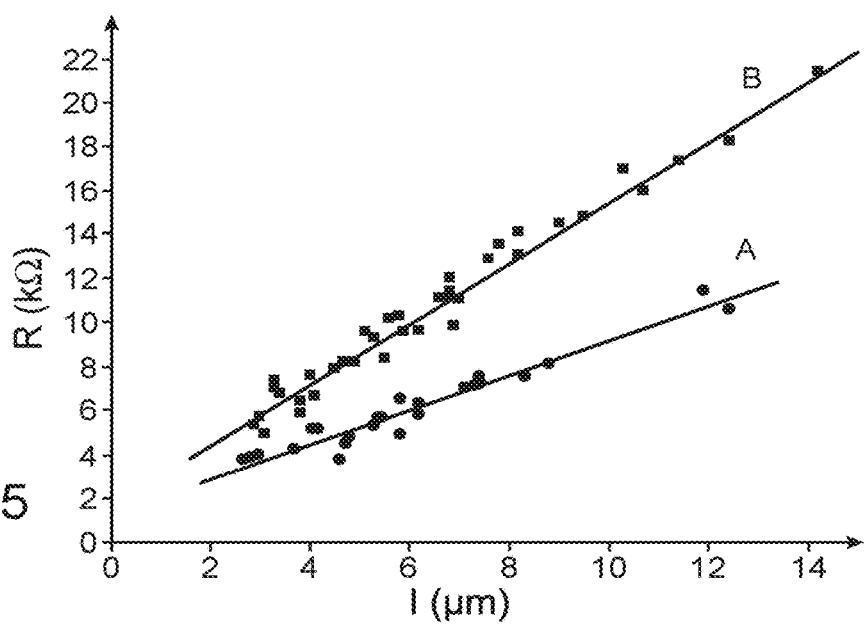

Other characteristics and advantages will emerge in the description that follows of the embodiments of the manufacturing method according to the invention, given as non-restrictive examples, with reference to the appended illustrations wherein:

FIG. 1 is a schematic representation of a method for manufacturing an electrical contact on a structure known in the state of the art, FIG. 2 is a schematic representation of a metallic edge contact on a structure, obtained by a method known in the state of the art, FIG. 3 is a schematic representation of a method of formation of an electrical contact on a structure according to one embodiment of the invention, FIG. 4 is a schematic representation of a bundle of carbon nanotubes, FIG. 5 shows the resistance R, in kΩ, (on the vertical axis) of a bundle of carbon nanotubes as a function of the length l, in μm, (on the horizontal axis) of this bundle of carbon nanotubes, where the first curve A relates to the results obtained with the method according to the invention, whilst curve B relates to the results obtained using a method known in the state of the art.

Figure 6:
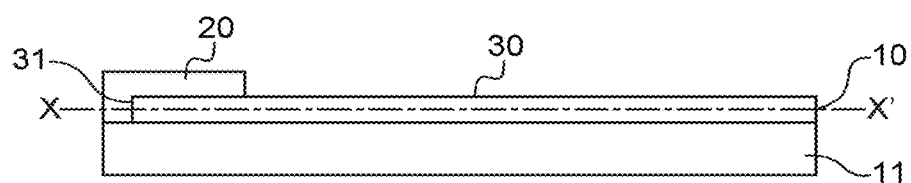

FIG. 6 is a schematic representation of another embodiment example of an electric contact on a structure.

DETAILED DESCRIPTION OF PARTICULAR EMBODIMENTS

The invention described in a detailed manner below implements a step for the formation of an electrode on a structure followed by a step for implanting species X through said conductive electrode. It will appear clearly in the detailed description that the order of execution of these two steps is essential in the first place, in order to ensure electrical contact between the conductive electrode and the structure of low resistance. In the second place, we will also see that the presence of the conductive electrode has a protective effect on the structure during the implantation step.

For the various implementation embodiments, the same references will be used for the same elements or elements which carry out the same functions, for the purpose of simplification of the description.

In FIG. 3 an embodiment example of the method for manufacturing an electrical contact on a structure 10 can be seen.

The structure 10 according to the invention may be a component for microelectronics, photonics, optronics, spintronics or transparent conductive electrodes.

For example, the structure 10 may be a transistor, a wave guide, a horizontal interconnection, active microelectronic devices made using carbon nanotubes or graphene or transition metal dichalcogenides ($MoS_2$ for example), conductive transparent electrodes based on carbon nanotubes or graphene, sensors based on anisotropic materials.

The structure 10 may rest on a support 11, for example a silicon substrate.

The structure 10 according to the invention is made of an anisotropic material NA. The anisotropic material NA exhibits anisotropic electrical conductivity.

Thus the structure 10 exhibits an axial electrical conductivity $_{all}$ along a first elongation axis XX' of said structure 10. The structure 10 also exhibits at least one orthogonal electrical conductivity $\sigma_\perp$ along at least one direction YY' orthogonal to the first axis XX'. The anisotropy of the electrical conductivity of the structure 10 is a result of the anisotropy of the electrical conductivity of the anisotropic material NA.

The structure 10 comprises a first surface 30. The first surface 30 is orthogonal to the at least one directions YY'.

The structure 10 may comprise at least one of the anisotropic materials NA chosen from amongst: an insulated carbon nanotube, a bundle of carbon nanotubes, graphene, transition metal dichalcogenides (for example $MoS_2$, $MoSe_2$, $WS_2$, $WSe_2$), 2D materials, Van der Waals heterostructures (stacks of 2D materials).

The term 2D material means an anisotropic material made up of a single layer of atoms or of molecules which exhibit a first electrical conductivity along a crystallographic plane and a second electrical conductivity, different from the first electrical conductivity (for example less than the first electrical conductivity) along a direction perpendicular to said crystallographic plane. Graphene and transition metal dichalcogenides are examples of 2D materials.

By way of an example, the structure 10 may be made of a bundle of carbon nanotubes. A bundle of carbon nanotubes 40 is an arrangement comprising a plurality of carbon nanotubes arranged parallel to each other and in contact with each other. In this case the first axis XX' of the structure corresponds to the axis of elongation of the carbon nanotubes forming the bundle of carbon nanotubes (FIG. 4). The bundle of carbon nanotubes comprises a lateral surface, parallel to the first axis. The lateral surface constitutes the first surface 30.

Still by way of an example, the structure 10 may comprise graphene.

Graphene is a two-dimensional (2D) crystal in the form of sheets. A sheet comprises two faces which are essentially parallel, connected by a lateral surface. The first surface 30 is one of the two surfaces of the sheet. The electrical conductivity in a direction parallel to the faces of the sheet corresponds to the axial electrical conductivity $\sigma_{//}$, and is greater than the orthogonal electrical conductivity $\sigma_\perp$ along a direction perpendicular to the faces of the sheet. The axial electrical conductivity $\sigma_{//}$ is typically 100 to 10,000 times greater than the orthogonal electrical conductivity $\sigma_\perp$.

The method of manufacture of an electrical contact according to the invention comprises a step for the formation of a conductive electrode 20 of initial thickness $E_i$ on the first surface 30 of the structure 10. The conductive electrode 20 comprises a species M. The term species M means a chemical species M. The conductive electrode 20 may, for example, be a metallic electrode, an electrode made of a semiconductor material of small forbidden band ("Gap"), an electrode made of conductive oxide, an electrode made of a 2D material.

The species M may comprise at least one of the elements chosen from amongst: Pd, Au, Ti, Ta, Cr, Al, Mo, Co, W, Ni, Pt, Zr, Nb, Ga, In, Bi.

The initial thickness $E_i$ of the conductive electrode 20 may be between 0.1 nm and 50 nm. The implantation may be implemented without necessarily involving a thinning of the conductive electrode (by sputtering) during implantation. The range of thicknesses thus proposed therefore allows implantation by recoil for reasonable dose values and energy values of the species X.

The conductive electrode 20 is in general only formed on a portion of the first surface 30, in particular when the structure 10 forms a transistor, for example. By way of an example, the structure 10 may comprise a bundle of carbon nanotubes of diameter 155 nm. The conductive electrode 20 formed on the structure may exhibit a thickness of 10 nm and a width of 3 μm To this end, the formation of the conductive electrode 20 may comprise the following successive steps:
1. a photo-lithography step to demarcate the conductive electrode 20 using a photosensitive resin PR.
2. a step for deposition of a species M, using an evaporation method, for example.

The photosensitive resin PR deposited in step 1 may advantageously be retained for the remainder of the method according to the invention.

Steps 1 and 2 for formation of the conductive electrode 20 are steps that are well known to those skilled in the art and will not be detailed in the disclosure.

The step for formation of the conductive electrode 20 on the first surface 30 is followed by a step for implantation of species X in the conductive electrode 20 and the structure 10. The step for implantation of the species X may advantageously be carried out exclusively through the conductive electrode 20. For example, a mask which offers an opening which corresponds to the conductive electrode 20 may be arranged on the structure 10. The term mask means a barrier (or obstacle) to the implantation of the species in the structure 10. Thus the mask which has an opening that corresponds to the conductive electrode 20 allows the implantation of species X to be carried out solely through the conductive electrode 20. Advantageously, the photosensitive resin PR demarcating the conductive electrode 20 also acts as a mask, so that the implantation of species X is only carried out through the conductive electrode 20.

The term implantation of species X in the structure 10 means the implantation of species X within the volume of the structure 10.

The implantation step may be carried out using an ion implant device adapted so as to carry out ion bombardment of species X. During the implantation, the species X are accelerated, and therefore have an energy referred to as "implantation energy". The implantation energy may be between 0.1 and 1000 keV. The dose of species X may be between $10^{10}$ and $10^{18}$ ions per cm². The implanted species X may comprise at least one of the elements chosen from amongst: Pd, Au, Ti, Ta, Cr, Al, Mo, Co, W, Ni, Pt, Zr, N b, Ga, In, Bi, Ar, Kr, Xe, S, Se, Te.

During the implantation step, the species X penetrate the volume of the structure 10 to an implantation depth Rp. The implantation depth depends not only on implantation parameters (the chemical nature of the species X, the implantation energy), but also on the chemical nature and the thickness of the conductive electrode 20, and on the chemical nature of the structure 10. Those skilled in the art will be capable of determining the implantation depth Rp.

The step for implantation of the species X may be followed by thermal annealing carried out at a temperature of between 300 and 500° C. in an inert or reducing atmosphere (for example Argon or Nitrogen). The annealing time may be between 30 minutes and 2 hours. The thermal annealing also reduces the contact resistance between the structure 10 and the conductive electrode 20.

The invention is not limited to a step for implantation of species X carried out using an ion implantation device or a plasma-immersion ion implantation device. Indeed, the implantation step may also be implemented using high energy ion bombardment carried out using plasma. In particular, low pressure argon capacitive coupling radio-frequency plasma can be used, where this latter offers the advantage of being more readily available and less costly to operate than an ion implantation device. By way of an example, a multi-wall carbon nanotube may be placed in electrical contact using the method according to the invention by carrying out a 60 second plasma treatment (capacitive coupling radio-frequency argon plasma at 10 mTorr and 600 W power), onto a 3 nm thick palladium conductive electrode 20.

The inventors have moreover discovered that the execution of the implantation step after the formation of the conductive electrode 20 is particularly advantageous and protects the structure 10. Indeed, the structure 10 made of anisotropic material NA may be damaged during the step for the implantation of species X. In this regard the Applicant observed complete destruction of a structure 10 made of carbon nanotubes without protection (mask and conductive electrode 20) during the step for implantation of species X. Thus the presence of the conductive electrode 20 allows the carbon nanotubes to be protected during the implantation step.

In a particularly advantageous manner, the species X implanted in the structure may be adapted to form chemical bonds with the anisotropic material NA. Thus the step for implantation of species X may have two effects:
A/ a reduction of the tunnel barrier between the conductive electrode 20 and the structure 10.
B/ controlled de-structuring of the anisotropic material NA forming the structure 10 beneath the metallic contact surface between the conductive electrode 20 and the structure 10 (in FIG. 3). Said de-structuring opens up the possibility of forming chemical bonds between the implanted species and the anisotropic material NA. This second effect also reduces the anisotropy of electrical conductivity of the structure 10 only in the implanted volume of the structure 10.

Moreover, and particularly advantageously, the step of implantation of species X may cause recoil implantation of the species M contained in the conductive electrode 20.

The recoil implantation of the species M is induced by the bombardment of the conductive electrode 20 by the species X during the implantation step. The atoms M (the species M) contained in the conductive electrode 20 are then "pushed" into the structure 10 during collisions between the species X and the species M. In this regard, those skilled in the art will find a description of the recoil implantation phenomena in documents [8], [9] and [10] cited at the end of the patent application.

The thickness of the conductive electrode 20 and the dose of the implanted species X are to be chosen so as to ensure that the residual thickness of the conductive electrode 20 after any sputtering by the species X is such that the species M, contained in the conductive electrode 20, may be recoil implanted into the structure 10.

Thus when the thickness Ei of the conductive electrode 20 is between 0.1 nm and 50 nm recoil implantation of the species M into the structure may be observed for reasonable implantation energies and doses.

Recoil implantation of species M in the structure 10 thus creates a diffuse interface between the conductive electrode 20 and the structure 10.

In a particularly advantageous manner, the species M is also adapted to form chemical bonds with the anisotropic material NA. Thus when the species M are also recoil implanted into the material NA, the formation of chemical bonds between the species M and the material NA is possible. The diffuse character of the interface between the conductive electrode 20 and the structure 10 is enhanced. Moreover, recoil implantation of the species M also contributes to the reduction in anisotropy of the electrical conductivity of the recoil implanted volume of the structure 10. The origin of this reduction in the anisotropy is the creation of conductive paths in the direction YY' (perpendicular to the first surface 30) in the case of thick structures 10 (example bundles of carbon nanotubes or Van der Waals heterostructures), and/or the reduction of parallel conductivity $\sigma_{//}$ under the effect of controlled de-structuring of the structure 10. The recoil implantation can be implemented once the thickness of the conductive electrode 20 becomes comparable with or less than the penetration depth of the species X into said conductive electrode 20. This penetration depth is known to those skilled in the art for various pairs of species M/X as a function of the implantation energy of the species X.

Particularly advantageously, and since the thickness of the conductive electrode 20 after implantation may differ from the initial thickness $E_i$ of said conductive electrode 20:
the implantation energies of the species X may be sufficiently high for the X species to pass through the entire thickness of the structure 10 in the absence of a conductive electrode 20.
and the thickness of the conductive electrode 20 and the dose of the implanted species X may be chosen so as to ensure that the residual thickness of the conductive electrode 20 after any sputtering by the species X is such that the species M can be recoil implanted into the structure 10.

Particularly advantageously, the species X and the species M are of the same chemical nature and are advantageously identical. In such a case recoil implantation of species M contained in the conductive electrode 20 may also be observed.

By way of an example, a recoil implantation of atoms of Pd of a conductive electrode 20 made of Pd of initial thickness 10 nm may be observed in a bundle of carbon nanotubes if the implantation step comprises implantation of Pd ions at an implantation energy of 30 keV and a dose of 4.1015 ions/cm$^2$.

The step for implantation of the species X may atomize, at least partially, the conductive electrode 20. Thus the step for implantation of the species X may be carried out in such a way that at the end of said step the conductive electrode 20 exhibits a non-zero residual thickness which is less than the initial thickness E. Those skilled in the art may easily determine the conditions for implantation of the species X and/or the initial thickness $E_i$ allowing this result to be achieved.

The implantation step may also be followed by a step for thickening the conductive electrode 20. A conductive electrode 20 made of palladium for example may exhibit a thickness of 2 nm after the implantation step. Thickening may then include deposition of a layer of palladium (40 nm for example) and deposition of a layer of gold (150 nm for example).

Throughout the method according to the invention, the photosensitive resin PR demarcating the conductive electrode may be retained. Thus the photosensitive resin PR constitutes a mask which allows demarcation of implantation through the conductive electrode 20 only and protects the rest of the structure 10 from direct X ion bombardment. Those skilled in the art will be able to ensure that the thickness of the photosensitive resin PR is sufficient in this respect.

In this case the photosensitive resin PR is removed at the very end of the method according to the invention (but before any annealing).

In the remainder of the disclosure three examples of implementation of the invention will be described.

By way of a first example, the structure 10 therefore comprises a bundle of carbon nanotubes of diameter 155 nm. The bundle of carbon nanotubes comprises several hundred carbon nanotubes of about 4.5 nm in diameter, each comprising about three walls. The bundle rests on a layer of silicon dioxide formed on a silicon substrate. A conductive electrode 20 made of Palladium (Pd) and of initial thickness 10 nm is formed according to the method illustrated in FIG. 3. The formation of the conductive electrode 20 is followed by a step of implantation of gold atoms with an implantation energy of 30 keV, and a dose of $10^{16}$ ions per cm$^2$. The implantation step is then followed by a step for thickening the conductive electrode 20. The thickening comprises the deposition of 40 nm of palladium and of 150 nm of gold. FIG. 5 shows the resistance R of the nanotube bundle (on the vertical axis) as a function of the length l (on the horizontal axis) of this same bundle of carbon nanotubes. A first curve A relates to the results obtained with the method according to the invention. Curve B relates to the results obtained with a method known in the state of the art. Thus the method according to the invention allows a 70% increase in the proportion of carbon nanotubes electrically connected to the conductive electrode 20.

According to a second example, the structure 10 comprises a monolayer of graphene arranged on a layer of silicon dioxide formed on a silicon substrate. The conductive electrode 20 comprises, in this example and before the step for implantation of species X, a layer of palladium of thickness 7 nm. The step for implantation of species X is carried out at an implantation energy of 10 keV, and a palladium atom dose of $10^{14}$ cm$^{-2}$.

For this second example the electrical contact can in particular be made via the implantation of palladium ions (Pd) at 10 keV, with a dose of $10^{14}$ ions per cm$^2$ in a layer M of 7 nm of Pd.

According to a third example shown in FIG. 6, the conductive electrode 20 is made so as to be contiguous with an edge contact (covering of a surface 31 of the structure 10, where the surface 31 is perpendicular to the direction XX') with the method described in the first example in order to create a mixed edge-plus-top contact.

The method according to the invention thus allows an electrical contact to be formed on a structure 10 made from an anisotropic material, which exhibits a low contact resistance.

Moreover, the method proposed by the inventors is easier to implement than an edge contact.

Furthermore, the method according to the invention is less sensitive to contaminants (and more particularly to carbon contaminants often present on structures 10 made from, for example, carbon nanotubes or graphene). Consequently the method is less demanding in terms of cleaning in comparison with micro-electronics methods.

REFERENCES

[1] Adrien Allain et al., "Electrical contacts to two-dimensional semiconductors" Nature Materials, 14, 1195-1205, (2015),
[2] U.S. 2013/0059134,
[3] Debdeep Jena et al., "2D crystal semiconductors: Intimate contacts", Nature Materials 13, 1076 (2014),
[4] Jiahao Kang, "High-performance MoS2 transistors with low-resistance molybdenum contacts", Applied Physics Letters 104, 093106 (2014),
[5] Joshua T. Smith et al., "Reducing Contact Resistance in Graphene Devices through Contact Area Patterning", ACS Nano, 2013, 7 (4), pp 3661-3667,
[6] Wei Sun Leong et al., "Low-Contact-Resistance Graphene Devices with Nickel-Etched-Graphene Contacts", ACS Nano, 2014, 8 (1), pp 994-1001,
[7] Joshua A. Robinson et al., "Contacting graphene", Appl. Phys. Lett. 98, 053103 (2011),
[8] EP 0 067 090131,
[9] Nelson R. S., "The theory of recoil implantation", Radiation effects 2, 47 (1969),
[10] Dearnaley G., "Bombardment-diffused coatings and ion beam mixing", Radiation effects 63, 25 (1982).

The invention claimed is:

1. Method for manufacture of an electrical contact on a structure made of an anisotropic material NA which exhibits an anisotropic electrical conductivity, where the structure exhibits an axial electrical conductivity $\sigma_{//}$ along a first axis XX' of the structure and at least one orthogonal electrical conductivity $\sigma_{\perp}$ along at least one direction YY' orthogonal to the first axis XX' of the structure, where the at least one electrical conductivities $\sigma_{\perp}$ are less than the axial electrical conductivity $\sigma_{//}$, where the method comprises:

a step for the formation of a conductive electrode, with an initial thickness Ei, comprising at least one species M, on a first surface of the structure, where the first surface is orthogonal to the at least one directions YY';

the method being characterized in that the step for the formation of the conductive electrode is followed by a step for implantation of species X through the conductive electrode, into the structure.

2. Method according to claim 1, wherein the step for implantation of the species X is carried out solely through the conductive electrode.

3. Method according to claim 1, wherein the species M is implanted by recoil into the structure during the step for implantation of the species X.

4. Method according to claim 1, wherein the species M is adapted to form chemical bonds with the anisotropic material NA.

5. Method according to claim 1, wherein the species X are adapted to form chemical bonds with the anisotropic material NA.

6. Method according to claim 1, wherein the species X and the species M are of the same identical chemical nature.

7. Method according to claim 1, wherein the implantation step is carried out using an implantation energy of the species X which confers upon the species X sufficient energy to pass through the structure, when it is without the conductive electrode, in its entirety through the first surface and along a direction YY' orthogonal to said first surface.

8. Method according to claim 1, wherein the step for implantation of the species X is carried out in such a way that at the end of said step the conductive electrode exhibits a non-zero residual thickness which is less than the initial thickness Ei and than the implantation depth Rp of the species X in the conductive electrode.

9. Method according to claim 1, wherein the step for implantation of species X is followed by a step comprising thickening of the electrode.

10. Method according to claim 1, wherein the anisotropic material NA comprises one or more materials chosen from amongst: an insulated carbon nanotube, a bundle of carbon nanotubes, graphene, transition metal dichalcogenides, 2D materials, Van der Waals heterostructures.

11. Method according to claim 1, wherein the species M comprises at least one of the elements chosen from amongst: Pd, Au, Ti, Ta, Cr, Al, Mo, Co, W, Ni, Pt, Zr, Nb, Ga, In, Bi.

12. Method according to claim 1, wherein the initial thickness Ei is between 0.1 nm and 50 nm.

13. Method according to claim 1, wherein the implanted species X comprise at least one of the elements chosen from amongst: Pd, Au, Ti, Ta, Cr, Al, Mo, Co, W, Ni, Pt, Zr, Nb, Ga, In, Bi, Ar, Kr, Xe, S, Se, Te.

14. Method according to claim 1, wherein the step for implantation of species X is carried out at an implantation energy of between 0.1 and 1000 keV.

15. Method according to claim 1, wherein the step for implantation of species X is carried out in accordance with a dose of species X of between $10^{10}$ and $10^{18}$ ions per cm$^2$.

16. Method according to claim 1, wherein the step for implantation of species X is followed by thermal annealing carried out at a temperature of between 300 and 500° C., in an inert or reducing atmosphere.

\* \* \* \* \*